United States Patent
Moors et al.

(10) Patent No.: US 6,781,673 B2
(45) Date of Patent: Aug. 24, 2004

(54) MASK HANDLING APPARATUS, LITHOGRAPHIC PROJECTION APPARATUS, DEVICE MANUFACTURING METHOD AND DEVICE MANUFACTURED THEREBY

(75) Inventors: Johannes Hubertus Josephina Moors, Helmond (NL); Vadim Yevgenyevich Banine, Helmond (NL); Martinus Hendrikus Antonius Leenders, Rotterdam (NL); Henri Gerard Cato Werij, Rotterdam (NL); Hugo Matthieu Visser, Utrecht (NL); Gerrit-Jan Heerens, Schoonhoven (NL); Erik Leonardus Ham, Rotterdam (NL); Hans Meiling, Bilthoven (NL); Erik Roelof Loopstra, Heeze (NL); Sjoerd Nicolaas Lambertus Donders, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/934,698

(22) Filed: Aug. 23, 2001

(65) Prior Publication Data
US 2002/0109828 A1 Aug. 15, 2002

(30) Foreign Application Priority Data

| Aug. 25, 2000 | (EP) | 00202960 |
| Sep. 4, 2000 | (EP) | 00307594 |
| Mar. 22, 2001 | (EP) | 01302647 |
| May 21, 2001 | (EP) | 01304489 |

(51) Int. Cl.$^7$ .................. G03B 27/62; G03B 27/42
(52) U.S. Cl. ............................. 355/76; 355/53
(58) Field of Search ........... 355/53, 30, 67–71, 355/72–76; 250/492.2, 492.21, 492.22, 492.23; 361/230–235

(56) References Cited

U.S. PATENT DOCUMENTS

| 4,695,732 A | * | 9/1987 | Ward .................. 250/492.2 |
| 4,983,864 A | | 1/1991 | Murai et al. |
| 5,222,112 A | | 6/1993 | Terasawa et al. |
| 5,469,963 A | | 11/1995 | Bonora et al. |
| 5,559,584 A | * | 9/1996 | Miyaji et al. ............. 355/73 |
| 5,567,949 A | | 10/1996 | Okino |
| 5,838,006 A | | 11/1998 | Veneklasen et al. |
| 6,160,262 A | * | 12/2000 | Aoki et al. ........... 250/492.21 |
| 6,169,652 B1 | * | 1/2001 | Klebanoff ............... 361/234 |
| 6,175,122 B1 | * | 1/2001 | Groves et al. ........ 250/492.23 |
| 6,279,249 B1 | * | 8/2001 | Dao et al. ................. 34/61 |
| 6,359,747 B1 | * | 3/2002 | Kuo ...................... 360/75 |
| 6,445,439 B1 | * | 9/2002 | McCullough ............. 355/30 |

FOREIGN PATENT DOCUMENTS

| EP | 0 987 601 A2 | 3/2000 |
| EP | 1 061 561 A1 | 12/2000 |

(List continued on next page.)

OTHER PUBLICATIONS

J.H. Moore et al., "Building Scientific Apparatus," Addison–Wesley, Reading, Massachusetts, US XP–002177354, pp. 319–322 (1983).

(List continued on next page.)

Primary Examiner—Henry Hung Nguyen
(74) Attorney, Agent, or Firm—Pillsbury Winthrop LLP (57) ABSTRACT

In a lithographic projection apparatus, an object such as a mask is shielded from stray particles by a particle shield using electromagnetic fields. The fields may be a uniform electric field, a non-uniform electric field or an optical breeze. The particle shield is fixed to the mask holder rather than the mask.

30 Claims, 9 Drawing Sheets

FOREIGN PATENT DOCUMENTS

| | | | |
|---|---|---|---|
| JP | 62-254352 | * | 11/1987 |
| JP | 401036916 A | * | 2/1989 |
| JP | 05 288696 | | 2/1994 |
| WO | WO99/45581 | | 9/1999 |

OTHER PUBLICATIONS

A copy of the European Search Report dated Sep. 13, 2001 issued in the corresponding European application No. 01 30 2647.

A copy of the European Search Report dated Oct. 23, 2001 issued in the corresponding European application No. 01 30 7169.

A copy of the European Search Report dated Oct. 23, 2001 issued in the corresponding European application No. 01 30 7163.

* cited by examiner

MASK HANDLING APPARATUS, LITHOGRAPHIC PROJECTION APPARATUS, DEVICE MANUFACTURING METHOD AND DEVICE MANUFACTURED THEREBY

BACKGROUND OF THE INVENTION

1) Field of the Invention

The present invention relates to particle shields, e.g. for preventing contaminant particles from reaching a mask. More particularly, the invention relates to the application of such particle shields in mask handling apparatus, mask storage boxes and/or in lithographic projection apparatus comprising:

- a radiation system for supplying a projection beam of radiation;
- a support structure for supporting patterning means, the patterning means serving to pattern the projection beam according to a desired pattern;
- a substrate table for holding a substrate; and
- a projection system for projecting the patterned beam onto a target portion of the substrate.

2) Description of Related Art

The term "patterning means" as here employed should be broadly interpreted as referring to means which can be used to endow an incoming radiation beam with a patterned cross section, corresponding to a pattern which is to be created in a target portion of the substrate. The term "light valve" can also be used in the context. Generally, the said pattern will correspond to a particular functional layer in a device being created in the target portion, such as an integrated circuit or other device (see below). Examples of such patterning means include:

A mask. The concept of a mask is well known in lithography, and it includes mask types such as binary, alternating phase shift, and attenuated phase shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. An example of such a device is a matrix addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix addressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means as here above set forth.

Lithographic projection apparatus can be used, for example, in the manufacture of integrated circuits (ICs). In such a case, the patterning means may generate a circuit pattern corresponding to an individual layer of the IC. This pattern can be imaged onto a target portion (e.g. comprising one or more dies) on a substrate (silicon wafer) which has been coated with a layer of radiation sensitive material (resist). In general, a single wafer will contain a whole network of adjacent target portions, which are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go. Such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate which is at least partially covered by a layer of radiation sensitive material (resist). Prior to this imaging step, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g. an IC. Such a patterned layer may then undergo various processes such as etching, ion implantation (doping), metallization, oxidation, chemo-mechanical polishing, etc., all intended to finish off an individual layer. If several layers are required, then the whole procedure or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book *Microchip Fabrication: A Practical Guide to Semiconductor Procesing*, Third Edition, by Peter van Zant, McGraw Hill Publishing Co., 1997, ISBN 0-07-067250-4, incorporated herein by reference.

In a lithographic projection apparatus, it is necessary to prevent any stray particles, which may be present in the apparatus from reaching, and becoming stuck to, the mask as they will then be imaged on the substrate and can be printed in the final device. Too high a level of contamination of the mask can lead to defective devices and the masks cannot generally be cleaned, or if cleanable can only be cleaned a limited number of times. In a lithographic projection apparatus using relatively long wavelength ultraviolet radiation, particles are prevented from reaching the mask by a pellicle. A pellicle is a thin membrane transparent to the radiation used in the projection beam of the lithographic apparatus and located parallel to but spaced from the mask. Contaminant particles moving towards the mask contact and stick to the pellicle. To ensure that the particles stuck to the pellicle are not printed on the substrate, the pellicle is spaced from the mask by a distance greater than the depth of focus at mask level.

However, it is not at present possible to provide a pellicle in a lithographic projection apparatus using UV radiation of 193 nm or 157 nm or extreme ultraviolet radiation for the exposure beam. Almost all materials are strongly absorptive of EUV radiation and a conventional membrane pellicle would have to be no more than about 30 nm thick in order not to cause unacceptable absorption of the projection beam. A membrane of this thickness would not have a sufficient lifetime in both a vacuum, during operation of the apparatus and atmospheric environment, during installation and service. Other stresses, such as optical stress and temperature variance would also likely destroy such a thin membrane very quickly.

An alternative approach to a separate pellicle membrane is to form a cap layer, again transparent to the exposure radiation, directly onto the mask. To be effective, the cap layer would need to be thicker than the depth of focus at mask level. The depth of focus at mask level is given by:

$$DOF = k_2 \cdot \frac{\lambda}{NA^2} \cdot \frac{1}{M^2} \quad (1)$$

where $\lambda$ is the wavelength of the EUV radiation, NA the numerical aperture at wafer level, M the magnification of the projection optics and $k_2$ a constant which is typically near 1. For EUV radiation of 13.5 nm, a numerical aperture of 0.25 and a magnification M of ⅕, the depth of focus at mask level is approximately 2.7 μm. The effect of such a layer on an EUV projection beam would be excessive. The transmission, T, of radiation through a material with thickness d is given by:

$$T = \exp\left(-\frac{d}{a}\right) \quad (2)$$

where a is the attenuation length of the material (i.e. the length over which the intensity drops by a factor of 1/e). Even for a material which is relatively transparent to radiation at 13.5 nm, the attenuation length is about 0.6 μm. Accordingly, a cap layer of thickness 2.7 μm would absorb about 99% of all EUV radiation.

Furthermore, when shorter wavelength radiation is used for the projection beam, the sensitivity to contaminants is increased. At EUV wavelengths, a contaminant particle of only 50 nm diameter can lead to a faulty image. The need to keep the mask and other optical elements clear of contaminant particles is therefore extremely great.

Yet further, the projection beam of radiation in a lithographic projection apparatus may cause electrons to be freed from any surface on which it is incident. The surfaces which the beam of radiation is incident on include mirrors in the radiation system and the projection system as well as the substrate, sensors and the patterning means. Freed electrons in turn may break the bonds in water and hydrocarbon molecules present on the surfaces, resulting in reactive contaminants that cause damage to the surface. OH, in particular seems to cause substantial damage. Furthermore, the decomposition of the molecule does not absorb the stray electrons, which can then return to the surface and cause further damage on the surface.

BRIEF SUMMARY OF THE INVENTION

It is an object of the present invention to provide a particle shield which is effective in mask handling apparatus and a lithographic projection apparatus using radiation of wavelength less than 200 nm, and especially extreme ultraviolet radiation, to prevent particles reaching the mask or any other component which requires protection from contamination, whilst avoiding unacceptable attenuation of the projection beam.

According to the present invention there is provided a lithographic projection apparatus comprising:

a radiation system for supplying a projection beam of radiation;

a support structure for supporting patterning means, the patterning means serving to pattern the projection beam according to a devised pattern;

a substrate table for holding a substrate; and a projection system for projecting the patterned beam onto a target portion of the substrate; characterized by a particle shield for generating an electromagnetic field so as to prevent particles to become incident on an object to be shielded.

The particle shield may generate a substantially uniform (purely) electric field, generally transverse to the direction of particles approaching the shielded object, so as to exert a force on all charged particles which will deflect them away from the object to be shielded. Although such a uniform electric field may not deflect neutral particles, the radiation of the projection beam in a lithographic apparatus, which is the principle source of energy for airborne particles in a lithographic apparatus, is strongly ionizing so that any particles likely to cause problems will almost certainly be charged and will generally have a charge many times the charge of an electron. A substantially uniform electric field can conveniently be generated using a capacitor like arrangement of conductive plates.

The particle shield may, alternatively or in addition, generate a non-uniform electric field so as to induce a dipole moment in neutral particles and then attract those particles in addition to charged particles. A non-uniform electric field can conveniently be generated using a charged elongate member.

The particle shield may further generate an alternating, or other time varying field, instead of or in addition to the uniform or non-uniform static fields.

The particle shield may also, again alternatively or in addition to the uniform or non-uniform electric fields, generate a transverse radiation beam (i.e. oscillating electric and magnetic fields), or optical breeze, which will transfer transverse momentum to particles entering the transverse beam and absorbing photons from it. The radiation wavelength can be chosen so as to be absorbed by all expected particles but not expose the resist should any stray radiation reach substrate level.

The particle shield can also be a radiation source directing ionizing radiation, e.g. suitably short wavelength electromagnetic radiation or an electron beam, across the front of the object to be shielded. With such an arrangement the object to be shielded can be charged positively, to repel positively charged ions, compared to its surroundings, and/or relatively negative collection plates can be provided to attract positively charged ions. This arrangement ensures protection of the object to be shielded even when the main projection beam is off.

The object to be shielded is preferably a mask, since particles adhering to the mask are most detrimental to the quality of the projected image, but may also be a mirror or other element in the illumination or projection systems. Particles incident on, and possibly chemically reacting with, such elements may cause a loss in the reflectivity and therefore errors in the illumination dose received at the substrate.

By using electromagnetic fields rather than a physical barrier, the particle shield of the present invention performs its function without any attenuation of the projection beam.

In a further aspect the invention provides a mask handling device comprising a chamber for enclosing a mask during handling, transportation or storage thereof; and a particle shield for preventing or reducing the contamination of at least the patterned surface of said mask by particles. Said particle shield may comprise a means for generating an electromagnetic field so as to prevent particles to become incident on at least the patterned surface of said mask.

The present invention also provides a device manufacturing method comprising the steps of:

providing a substrate which is at least partially covered by a layer of radiation sensitive material to said second object table;

providing a projection beam of radiation using a radiation system;

using patterning means to endow the projection beam with a pattern in its cross section;

projecting the patterned beam of radiation onto a target portion of the layer of radiation sensitive material; characterized by the step of:

generating an electromagnetic field so as to prevent particles to become incident on an object to be shielded.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, unless the context otherwise requires the terms "radiation" and "beam" are used to encompass all types of electromagnetic radiation, including ultraviolet radiation (e.g. with a wavelength of 365 nm, 248 nm, 193 nm, 157 nm or 126 nm) and EUV (extreme ultraviolet radiation, e.g. having a wavelength in the range 5 nm to 20 nm).

BRIEF DESCRIPTION OF THE DRAWINGS

The present invention and its attendant advantages will be described below with reference to exemplary embodiments and the accompanying schematic drawings, in which.

DETAILED DESCRIPTION OF THE INVENTION

In the various drawings, like parts are indicated by like references.

Embodiment 1

Figure 1:
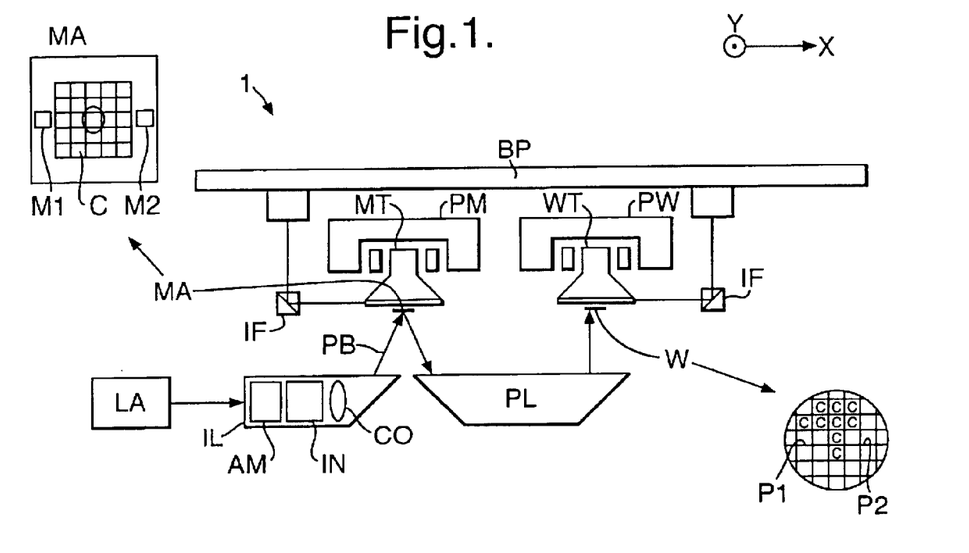
FIG. 1 depicts a lithographic projection apparatus according to a first embodiment of the invention.

FIG. 1 schematically depicts a lithographic projection apparatus according to a particular embodiment of the invention. The apparatus comprises:

a radiation system Ex, IL, for supplying a projection beam PB of radiation (e.g. EUV radiation), which in this particular case also comprises a radiation source LA;

a first object table (mask table) MT provided with a mask holder for holding a mask MA (e.g. a reticle), and connected to first positioning means PM for accurately positioning the mask with respect to item PL;

a second object table (substrate table) WT provided with a substrate holder for holding a substrate W (eg. a resist coated silicon wafer), and connected to second positioning means PW for accurately positioning the substrate with respect to item PL;

a projection system ("lens") PL (eg. a mirror system) for imaging an irradiated portion of the mask MA onto a target portion C (e.g. comprising one or more dies) of the substrate W. As here depicted, the apparatus is of a reflective type (i.e. has a reflective mask). However, in general, it may also be of a transmissive type, for example (with a transmissive mask). Alternatively, the apparatus may employ another kind of patterning means, such as a programmable mirror array of a type as referred to above.

The source LA (e.g. a discharge or laser produced plasma source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning means PW (and interferometric measuring means IF), the substrate table WT can be moved accurately, e.g. so as to position different target portions C in the path of the beam PB. Similarly, the first positioning means PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
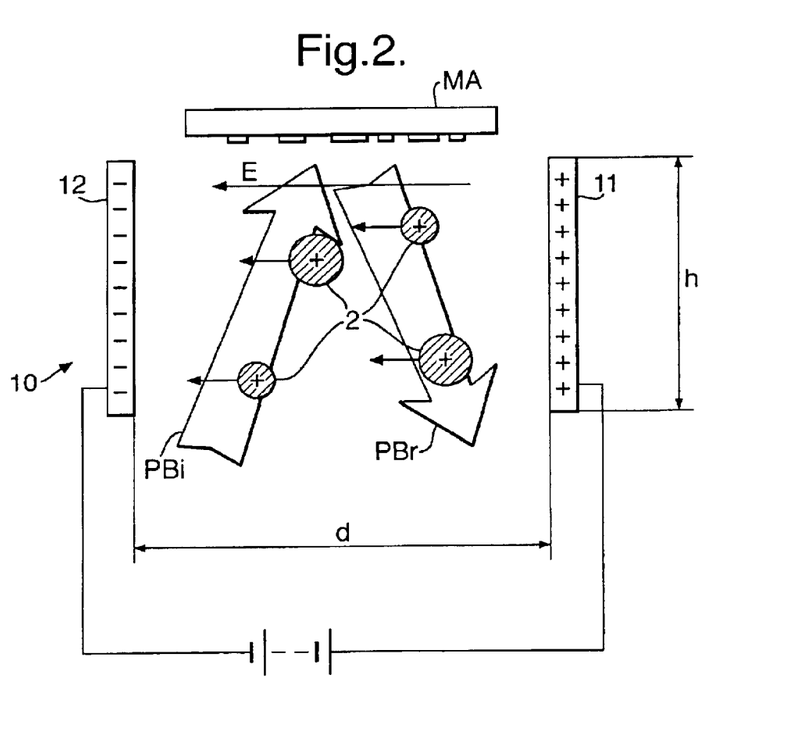
FIG. 2 is a diagram of a particle shield in the first embodiment of the present invention.

FIG. 2 shows an electrostatic particle shield 10 provided in the vicinity of mask MA. The particle shield 10 of the invention may be attached to the mask holder, mask table MT, a frame of the apparatus or any other suitable means, rather than the mask itself, as are conventional pellicles. It will be seen that the mask MA is reflective and disposed generally horizontally with the reflecting surface facing downward. The incident projection beam PBi is directed from the illumination system IL generally upwardly onto the mask MA and the reflected projection beam PBr is then reflected downwards to the projection system PL. As the operative surface of the mask faces downwards, gravity will tend to keep particles present in the apparatus away from the mask. However the powerful EUV projection beam provides energy to particles in its path which can enable them to overcome gravity. In particular, photons in the incident projection beam PBi colliding with particles will impart a generally upward momentum. Thus, contaminant particles can be driven towards the mask MA where they will cause undesirable contamination. Brownian motion of contaminant particles also yields a direction of motion towards the mask or another sensitive object. Moving parts of the apparatus can also both create contaminant particles and provide transport energy to overcome gravity.

To prevent this, the electrostatic particle shield 10 comprises two capacitor like plates 11, 12 placed perpendicular to the mask on either side of it. The plates 11, 12 are oppositely charged so as to establish an electric field E between them. Assuming that the area of the plates 11, 12 is substantially greater than their separation, d, the electric field, E, is given by:

$$E = \frac{V}{d} \tag{3}$$

where V is the voltage across the capacitor. In an embodiment of the present invention, the separation, d, may be about 300 mm, approximately twice the width of a mask, and the potential difference between plates 11, 12 may be about 10 kV. This gives an electric field of 33 kV/m.

The force exerted on a charged particle in the electric field between capacitor plates 11, 12, is equal to the product of the charge on the particle and the electric field strength, E. In an operating lithographic apparatus using EUV exposure radiation it can be assumed that any particles entering the projection beam will become rapidly ionized. The energy of an EUV photon is 92 eV compared to an ionization energy of the order of only a few eVs. A particle of 20 nm diameter in a projection beam having a typical power density of 8 kW/m$^2$ will be impacted by about $1.7 \times 10^5$ photons per second and will thus very likely be multiply ionized. For a singly ionized particle, the worst case, the force exerted on the particle will be about $5.3 \times 10^{-15}$ N. It can be shown that this force is sufficient to prevent such particles reaching the mask. The time, t, taken for a particle to move from one capacitor plate to the other, the worst case situation, is given by:

$$t = \sqrt{\frac{2dm}{F}} \tag{4}$$

where m is the mass of the particle and F the electrical force. Table 1 below gives the transit time for various different sizes of particle, assuming a spherical particle having a density p equal to 2,000 kg/m$^3$.

| Particle Size | Time |
| --- | --- |
| 20 nm | 0.1 ms |
| 100 nm | 11 ms |
| 500 nm | 0.11 s |
| 1 μm | 0.35 s |

In the worst case, a particle ejected from a metal part in the apparatus, e.g. following a collision, could be moving at maximum at the speed of sound in the metal, e.g. about 5,000 m/s. A particle of 20 nm diameter moving at this speed through the capacitor will be deflected if the height, h, of the capacitor plates 11, 12 is about 500 mm and less at lower speeds. This is the case even if the particle is only minally charged. It should also be noted that, due to their substantially higher charge to mass ratios, any ions or charged molecules would be very quickly deflected by the electrostatic particle shield 10.

In a variant of the first embodiment, an alternating voltage is provided between electrodes 11 and 12 to generate a plasma that is confined between the electrodes and serves as a barrier to contaminant particles approaching the mask MA. Neutral particles approaching the plasma will rapidly become ionized and trapped in the plasma. The plasma may be formed in a atmosphere of an inert gas, e.g. Argon, at a pressure of the order of 1 mbar. The alternating voltage may be such as to establish a field strength of about 100 to 500 V/cm and may have a frequency of about 1 to 10 MHz.

Embodiment 2

Figure 3:
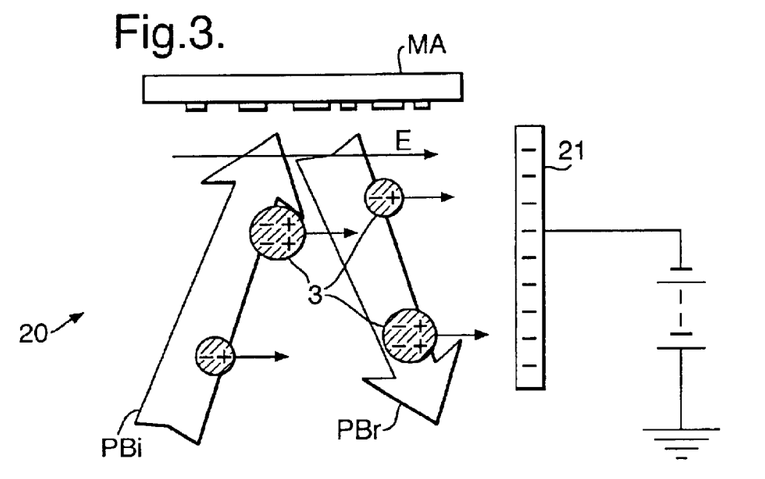
FIG. 3 is a diagram of a particle shield in a second embodiment of the present invention.

A second embodiment of the present invention, which may be the same as the first embodiment save as described below, includes an electrostatic particle shield 20 making use of a non-uniform electric field, which may prove more efficient.

The electrostatic particle shield 20 of the second embodiment of the invention is shown in FIG. 3. An elongate charged member 21 is placed perpendicular to and to one side of the mask MA, adjacent the volume traversed by the incident and reflected projection beams PBi, PBr. A single charged member, as opposed to a pair of charged plated forming a capacitor, forms a non-uniform electric field, which induces a dipole in neutral molecules and particles and then exerts a force on the dipole. A non-uniform electric field will also exert a force on polar molecules and so will capture these as well as neutral molecules or particles in which a dipole moment is induced. The force exerted on a dipole is given by:

$$\vec{F} = (\vec{p} \cdot \vec{\nabla})\vec{E} \quad (5)$$

where p is the induced dipole moment of the particle. The elongate charged member 21 can be approximated as a cylinder with a charge per unit length of the cylinder of μCoulomb/m. This will induce an electric field given by:

$$E(\vec{r}) = \frac{\mu}{2\pi\varepsilon_0 r} \quad (6)$$

where $\vec{r}$ is a position vector in an arbitrary coordinate system, r is the distance to the center of the cylinder, and $\varepsilon_0$ is the dielectric constant in vacuum. The electric field inside a sphere with dielectric constant s is given by:

$$E_{particle}(\vec{r}) = \frac{3}{\varepsilon+2}E(\vec{r}), \quad (7)$$

whilst the electric field which is induced by displaced charges inside the particle is given by:

$$E_{induced}(\vec{r}) = -\frac{\varepsilon-1}{\varepsilon+2}E(\vec{r}). \quad (8)$$

The polarization P is defined as the dipole moment per unit volume and given by:

$$P = \varepsilon_0(\varepsilon-1)E_{particle} = \frac{\varepsilon-1}{\varepsilon+2}3\varepsilon_0 E(r), \quad (9)$$

for a particle at a distance r from the center of the charged cylinder so that the particle having a radius $r_p$ can be replaced by a dipole with a moment, p, given by:

$$p = \frac{\varepsilon-1}{\varepsilon+2}4\pi\varepsilon_0 r_p^3 E(r). \quad (10)$$

Figure 4:
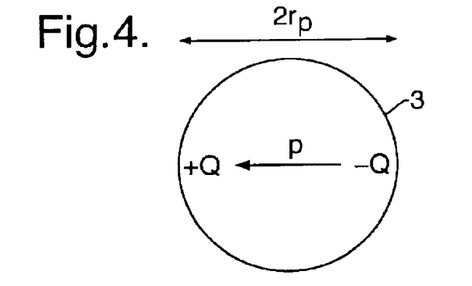
FIG. 4 is a diagram showing the induced dipole moment in a neutral particle.

The particle can thus be regarded as charges +Q, −Q separated by twice the radius $r_p$ of the particle, as shown in FIG. 4. The magnitude of the charges Q is given by:

$$Q = \frac{\varepsilon-1}{\varepsilon+2}2\pi\varepsilon_0 r_p^2 E(r) = \frac{\varepsilon-1}{\varepsilon+2}\frac{r_p^2 \mu}{r}. \quad (11)$$

From this, the force on the dipole can be expressed as:

$$F = QE(r-r_p) - QE(r+r_p) = \frac{Q\mu}{2\pi\varepsilon_0(r-r_p)} - \frac{Q\mu}{2\pi\varepsilon_0(r+r_p)} \quad (12)$$

which can be approximated, when the particle radius is small compared to the distance from the elongate charge member 21, as:

$$F \cong \frac{Q\mu}{2\pi\varepsilon_0 r} \cdot \frac{2r_p}{r} = \frac{Q\mu r_p}{\pi\varepsilon_0 r^2} = \frac{\varepsilon-1}{\varepsilon+2} \cdot \frac{\mu^2 r_p^3}{\pi\varepsilon_0 r^3}. \quad (13)$$

Because this force is dependent on the cube of the particle radius, the acceleration experienced by particles is independent of size. For a particle of density, ϱ, equal to 2,000 kg/m³ and a charge density, μ, of 10⁻⁷ Coulomb/m, the time to travel over a distance of about 150 mm, the size of a mask, for different dielectric constants, ε, is given in Table 2 below:

| ε | Time (s) |
| --- | --- |
| 2 | 224 |
| 3 | 177 |
| 5 | 158 |
| ∞(metal particles) | 112 |

Although it does take a significant time for the particles to reach the charged member 21, the non-uniform field will effectively capture neutral particles in the apparatus since the non-uniform field can be arranged to extend for a distance several times the mask width in front of the mask, allowing plenty of time for the particles to be deflected.

Embodiment 3

A third embodiment of the present invention, which may be the same as the first or second embodiment save as described below, employs an optical particle shield which creates an optical breeze to deflect contaminant particles.

Figure 5:
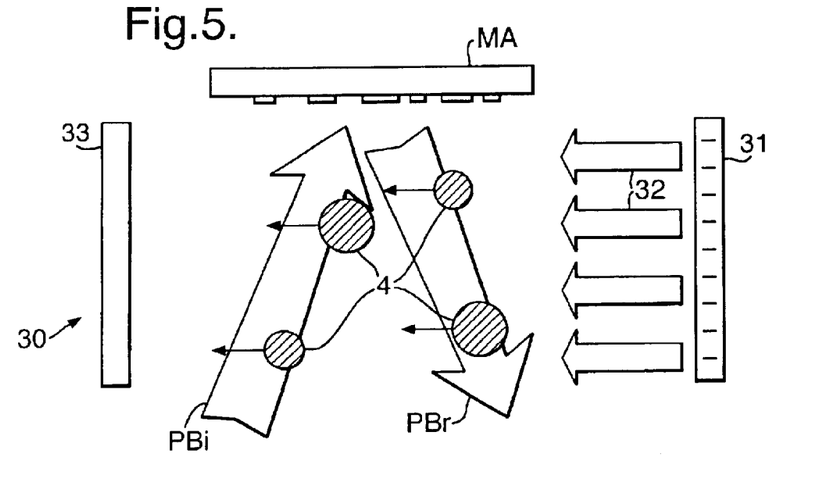
FIG. 5 is a diagram of a particle shield in a third embodiment of the present invention.

The third embodiment is shown in FIG. 5 and comprises radiation source 31 which emits high intensity shielding beams 32 of electromagnetic radiation parallel to the mask MA and across the space in front of it. The radiation source 31 can be any suitable source, or array of sources, with appropriate collimating and/or directing means to direct the beam across the required space whilst minimizing generation of stray light outside the desired area. A beam absorber 33 may be placed on the other side of the space in front of the mask MA to absorb the shielding radiation and prevent reflections. The photons of the shielding beams 32 carry momentum $m_r$ which will be transferred to any particle which absorbs photons from the beams 32. The wavelength of the light in the particle shield 30 is therefore chosen to be absorbed by all particles expected. The wavelength may also be chosen as one to which the resist used is not sensitive so that any stray light, which does reach the substrate, does not expose the resist.

The pressure exerted by a radiation beam of intensity I per $m^2$ is given by:

$$P_{BEAM} = \frac{I}{c} \quad (14)$$

where c is the velocity of light ($3 \times 10^8$ m/s). The acceleration of a spherical particle with radius $r_p$ and density $\rho$ is given by:

$$a_{breeze} = \frac{3I}{4cr_p\rho} \quad (15)$$

which is constant with time so that the time required to travel over a distance d is given by:

$$t = \sqrt{\frac{2d}{a_{breeze}}} = \sqrt{\frac{8dcr_p\rho}{3I}} \quad (16)$$

The time taken for particles of various sizes to travel over a distance of 150 mm, the approximate size of a mask, are given in Table 3 below, assuming a particle density, $\rho$, of 2,000 kg/$m^3$ and an intensity of 8 kW/$m^2$.

| Particle Size (nm) | Time (s) |
| --- | --- |
| 10 | 0.4 |
| 25 | 0.6 |
| 50 | 0.9 |
| 100 | 1.8 |

Again, if the optical particle shield 30 is arranged to extend over a substantial distance in front of the mask MA, a significant deflection can be achieved. In particular, the optical particle shield can be arranged to have a similar radiation intensity to the projection beam PB so that the deflection force exerted by the optical shield is comparable to the force exerted by the projection beam tending to lift the particles towards the mask MA.

Embodiment 4

In a fourth embodiment, which may be the same as the first to third embodiments save as described below, additional ionizing radiation is provided in front of the element to be protected which is itself charged to repel ions approaching it.

Figure 6:
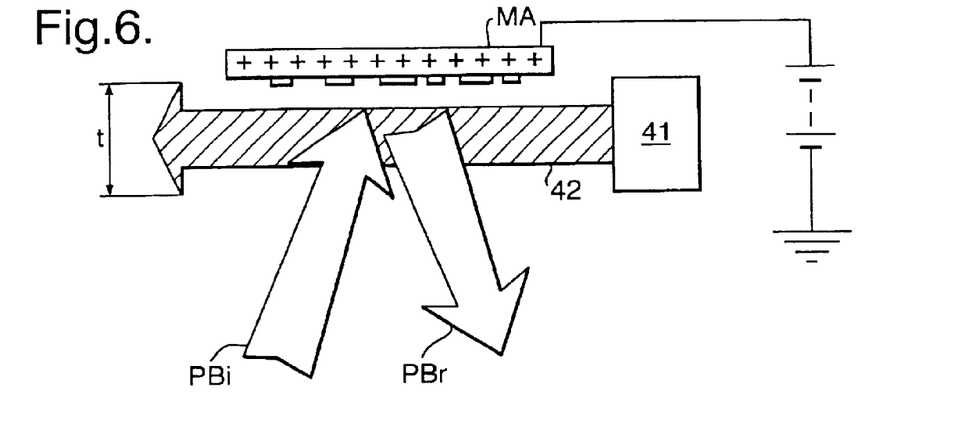
FIG. 6 is a diagram of a particle shield in a fourth embodiment of the present invention.

FIG. 6 shows ionizing radiation source 41, which directs a transverse beam 42 of ionizing radiation across the region in front of the element to be protected, in this case mask MA. The beam 42 has a thickness, t, perpendicular to the functional surface of the mask MA which is sufficiently large to ensure ionization, preferably multiple ionization, of most or all atoms approaching the mask MA. The wavelength of the radiation should be short (energetic) enough to ensure ionization of all atoms expected, and thus should preferably be shorter than 200 nm (6.2 eV). For example, an He discharge lamp emitting 59 nm radiation (21 eV) is suitable. Such sources are generally pulsed and in that case should have a repetition rate fast enough to irradiate all atoms passing through the protective region. For example, a repetition rate of 4 kHz may be used with a beam width of loomrn. A gas molecule moving at 400 $ms^{-1}$, a typical speed at room temperature, will traverse the shield in a minimum of 0.25 ms and thus will be illuminated by at least one pulse.

Embodiment 5

Figure 7:
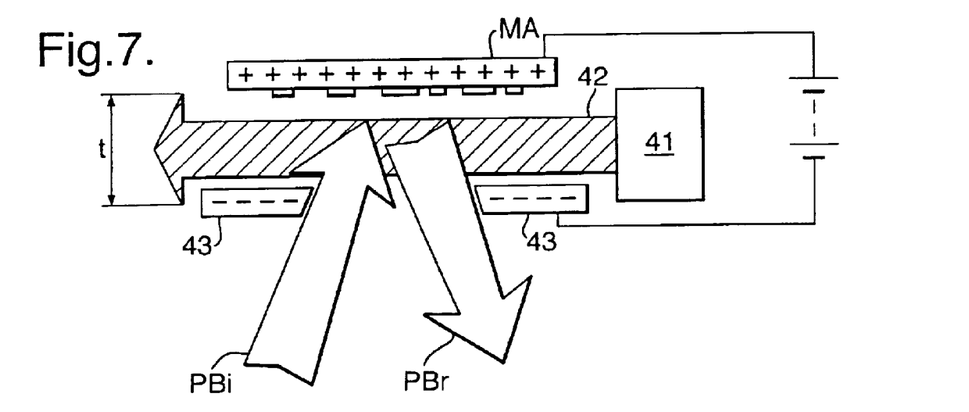
FIG. 7 is a diagram of a particle shield in a fifth embodiment of the present invention.

The fifth embodiment, shown in FIG. 7, is a variant of the fourth embodiment. In the fifth embodiment, collector plates 43, which are negatively charged relative to the mask MA, are added to increase the shielding effect. The collector plates 43 are situated on the other side of the protective beam 42 than the mask MA and serve to attract the positively charged ions repelled by the relatively positive mask MA.

Embodiment 6

Figure 8:
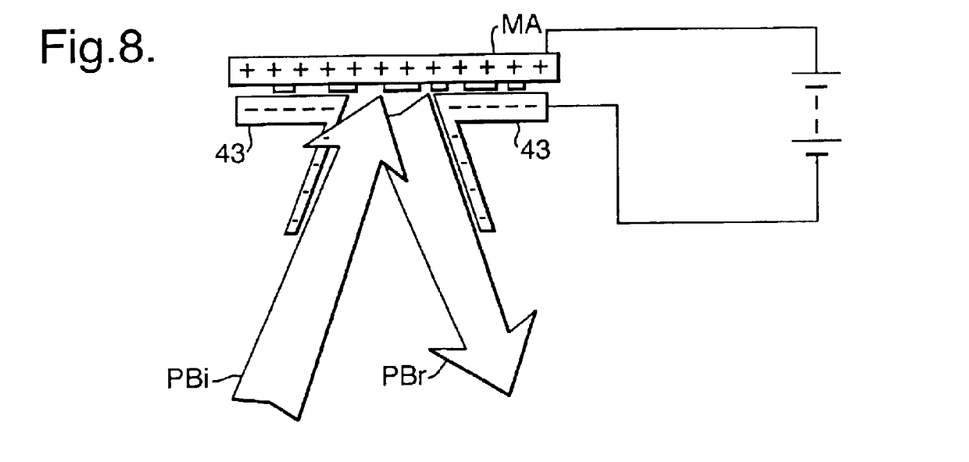
FIG. 8 is a diagram of a particle shield in a sixth embodiment of the present invention.

The sixth embodiment shown in FIG. 8, is a variant of the fifth embodiment but relies on the projection beam PB to ionize any contaminants approaching the mask MA. In this embodiment the collector shield 43 can be positioned closer to the mask and the path of the projection beam PB.

Embodiment 7

In a seventh embodiment, which may be the same as the previous embodiment s save as described below, a mesh (or grid) is provided at some distance from an object to be shielded so as to attract electrons that are freed from the object due to radiation incident on it.

Figure 9:
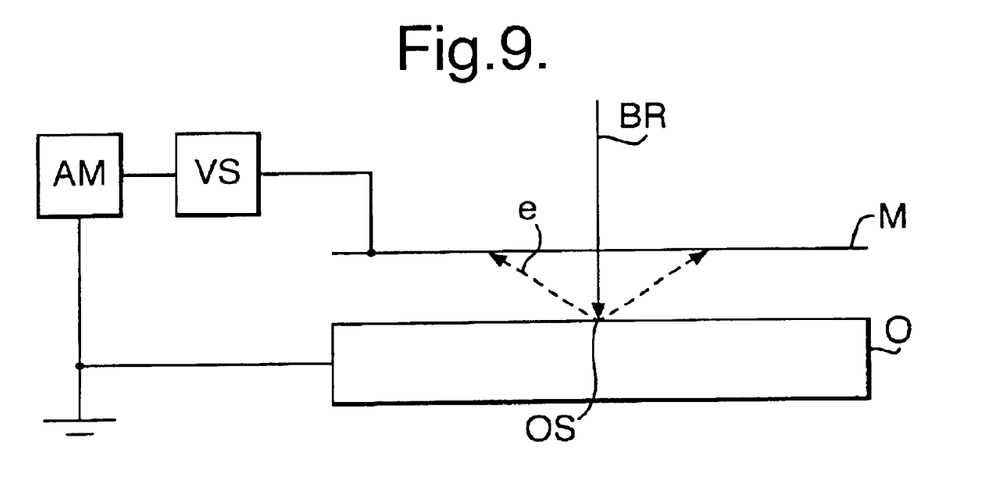
FIG. 9 is a diagram of a particle shield in a seventh embodiment of the present invention.

FIG. 9 shows a cross section of object O on the surface OS of which a beam of radiation BR is incident. The object O may be a substrate W, a patterning means such as mask MA, or a mirror within the radiation system IL or the projection system PL. The beam of radiation BR causes electrons e to be liberated from the surface OS of the object O. Mesh M is located substantially parallel to and at some distance from the surface OS of the object O. Voltage source VS is connected to the mesh M and applies a predetermined positive voltage to the mesh. Object O is electrically connected to ground potential. As a result the liberated electrons e are attracted to and collected by the mesh M. Object O may also be negatively biased to repel electrons.

Figure 10:
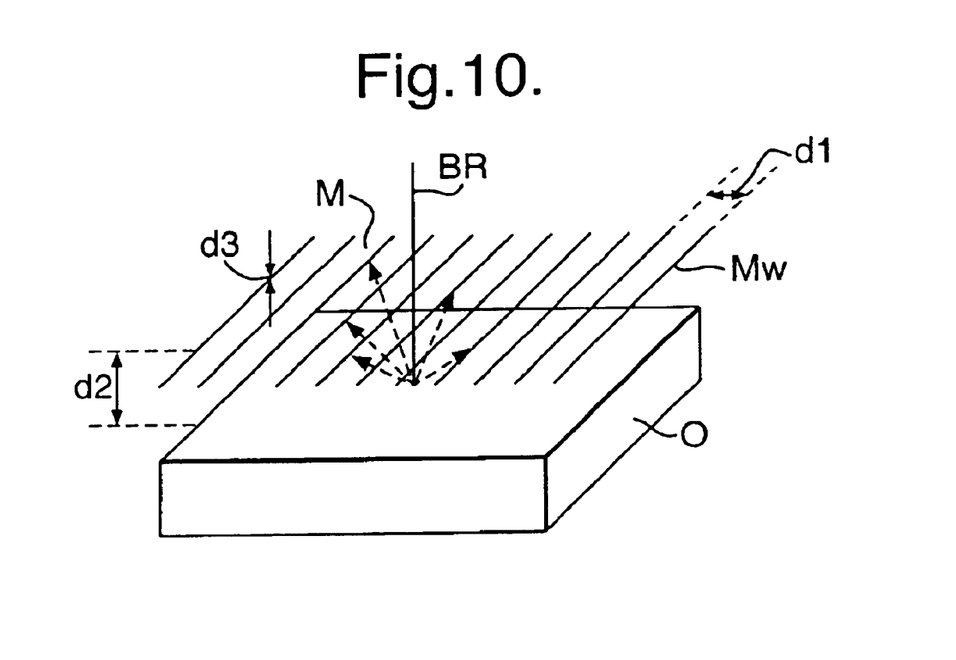
FIGS. 10, 11 and 12 are a perspective views of three variants of the seventh embodiment.

FIG. 10 shows the mesh M in perspective. In this case, the mesh is comprised of a plurality of parallel wires Mw. The thickness d3 of each of the wires is substantially smaller than the distance d1 between adjacent wires. This ensures that the mesh does not obscure the beam of radiation. Furthermore, the distance d1 between adjacent wires is smaller than the distance d2 of the wires from the surface 1a of the object O. This ensures that the electrical field from the wires to the surface is approximately uniform.

A suitable size range for the wires Mw is a thickness d3 of 2 μm to 10 μm. The wires are typically formed from a conductor such as tungsten, molybdenum, copper or zirconium. A particular advantage of zirconium is that it is relatively transparent to EUV. The distance d1 between the wires and the distance d2 of the wires from the surface OS are both typically of the order of 1 cm.

Figure 11:
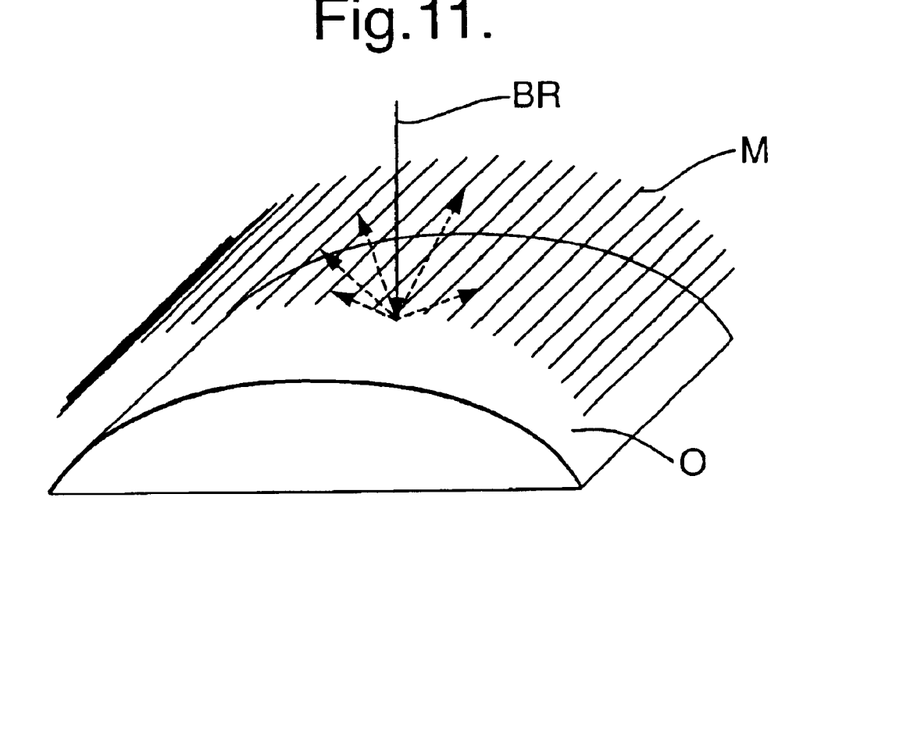
Figure 12:
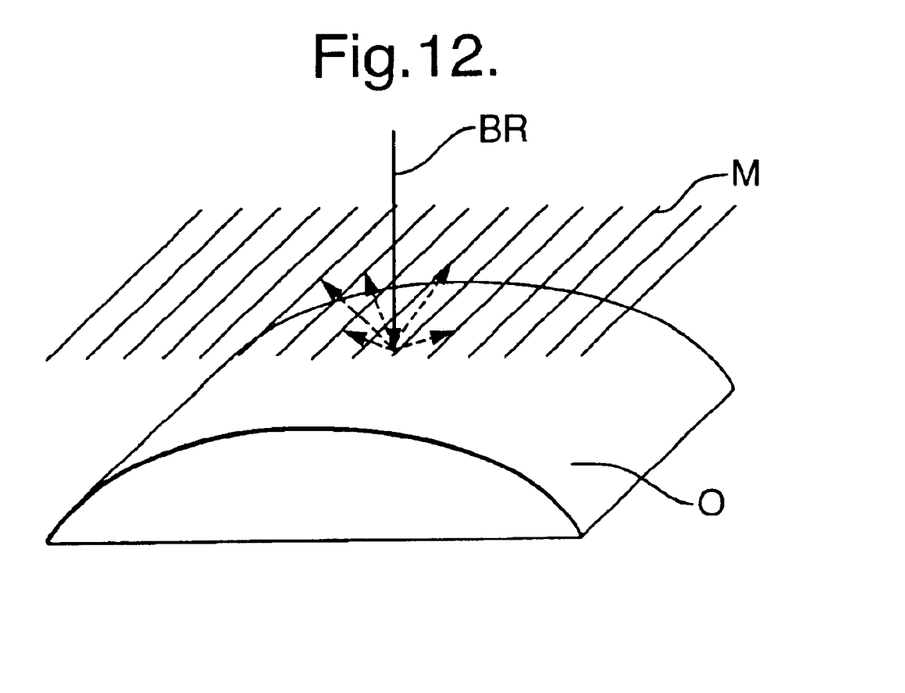

FIGS. 11 and 12 show the mesh in use with a curved object O. In FIG. 11, the mesh M is curved such that it approximately follows the curve of the object O. In FIG. 12, the mesh M is substantially planar. Although it is possible for the mesh to follow the curvature of the object O, it is not necessary. In some situations, it may not be possible to position the wires of the mesh to form a curve.

Whilst in the above description the mesh has been described as being comprised of a plurality of parallel wires, it will be appreciated that a variety of patterns may be used advantageously. In particular, there may be situations in which anchoring points for the wires of the mesh are limited, necessitating a different pattern.

Mesh M according to the seventh embodiment may advantageously be employed in combination with any one of the previous or subsequent embodiments. In such a case, the electrical field in between an object such as mask MA and mesh M will prevent freed electrons from falling back onto the mask and have them collected by the mesh. Positively charged particles (for instance, particles ionized by ionizing radiation) approaching the mask MA (or any object O in general) will be repelled or slowed down by the positive bias of the mesh and become deflected as described for the previous embodiments or as will be described further below. Mesh M will be positioned in between object MA and any of the above elements 11, 12, 21, 31 and 33. The electromagnetic shield will therefore be made up of several adjacent shielding electromagnetic (or purely electric) fields.

FIG. 9 further shows a sensing means AM to measure an electrical current induced by the collected electrons. The electrons freed by the photoelectric effect due to incident radiation from the projection beam and subsequently collected by the mesh M may be used as a measure for the intensity or dose of radiation or as a contamination monitor for the surface of object O.

Embodiment 8

Figure 13:
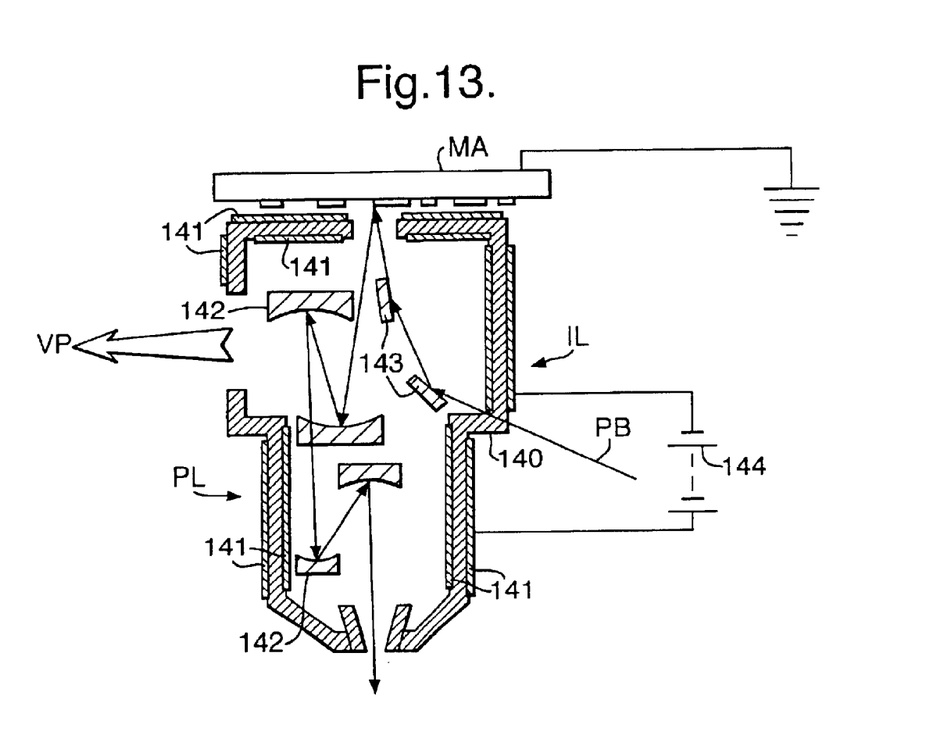
FIG. 13 is a diagram of relevant parts of a lithographic apparatus incorporating particle shields according to a eighth embodiment of the present invention.

FIG. 13 shows part of the illumination system IL, the mask MA and the projection system PL of a lithographic apparatus according to an eighth embodiment of the present invention, which is the same as the first embodiment save as described below.

In the eighth embodiment, a mirror box 140 partially encloses mirrors 142 forming the projection system PL and mirrors 143 forming at least part of the illumination system IL. The mirror box 140 may also be referred to as the projection optics box. According to the invention, the mirror box 140 is provided with electrodes 141 on most of its surfaces, internal and external. The electrodes 41 may be formed as conductive coatings on the surfaces of the mirror box 140. In use of the apparatus, the electrodes 141 are connected to a power supply 144 (e.g. 5 Volts) so that they become charged either positively or negatively. The mask MA or any other object (mirrors) to be shielded or some further electrodes are preferably earthed or connected to such an electrical potential as to generate a shielding electric field.

When the apparatus is in use, the mirror box 140 and the mirrors or other optical elements enclosed within it will be under vacuum (in some cases the mirror box 140 may form part of the vacuum chamber wall) and the charged electrodes 141 serve to attract particulates remaining in the vacuum system. Once the particulates have been attracted to and collide with the electrodes 141 they will tend to stick thereto and thus the amount of particulate contamination of the vacuum is reduced.

Preferably, as much free surface area as possible is provided with electrodes to maximize capturing of particulates in the vacuum. As well as the mirror box 140, capture electrodes can be provided on any suitable surface of the vacuum system, for example the rear surfaces of mirrors and other reflective optical elements. A preferable minimum is to provide all suitable surfaces facing and close to the mask with conductive electrodes. In the event that the mirror box 140 is conductive and any sensitive components attached to it can be insulated, it would be possible to charge the mirror box 140 itself to form the particle trap electrodes.

FIG. 13 further shows an arrow indicating a flow of gas towards a vacuum pump VP for evacuating the mirror box 140.

Embodiment 9

Figure 14:
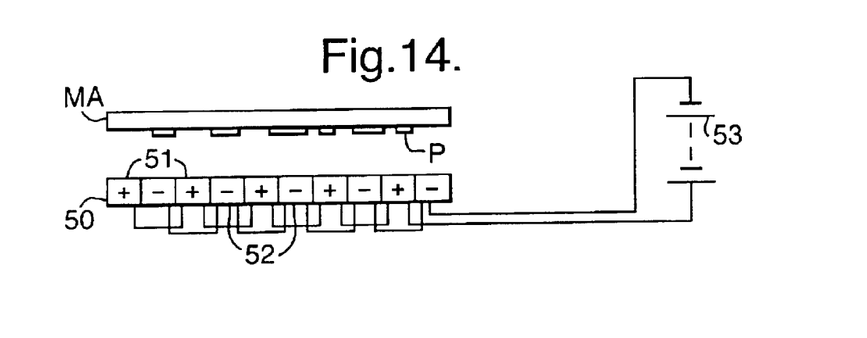
FIG. 14 is a diagram of a particle shield in an ninth embodiment of the present invention.

A ninth embodiment of the invention provides a particle shield or trap which is shown in FIG. 14 and can be used in a lithographic apparatus such as described with relation to the first embodiment or in a mask handling or transport apparatus, a mask storage box or an apparatus such as a mask writer.

The particle shield 50 of the ninth embodiment comprises a one- or two-dimensional grid or array of electrodes, 51, 52 which is disposed in proximity to the pattern side P of the mask MA. When the particle shield 50 is used in a mask handling apparatus or mask storage box it can cover the entire surface area of the pattern P. In a lithographic apparatus, the particle shield is either moved out of the way for exposures or provided with a slit corresponding to the illuminated area. To prevent small particles reaching the pattern side of the mask MA, adjacent ones of the electrodes 51, 52 are charged to opposite polarities by power source 53. This establishes electrostatic fields between the adjacent electrodes, which attract positive and negatively charged particles to the oppositely charged electrodes. It should be noted that the electrodes need not be continuously connected to the power supply. If they are well insulated and kept in a vacuum, sufficient charge may be retained by the electrodes to protect the mask MA for a period of time after the power supply has been disconnected.

Figure 15:
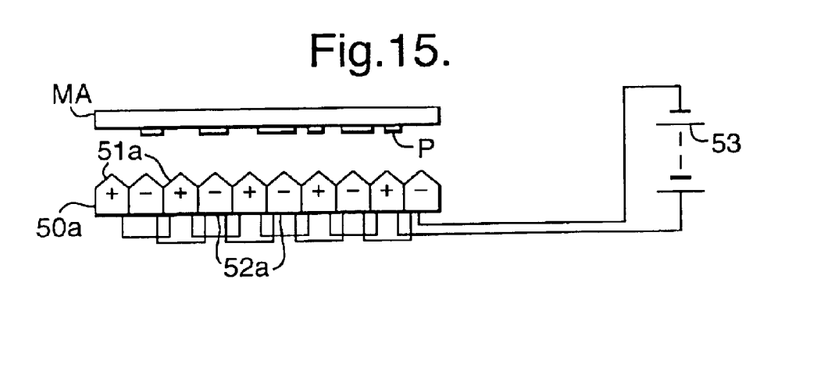
FIG. 15 is a diagram of a particle shield in a variant of the ninth embodiment of the present invention.

FIG. 15 shows a modified particle shield according to the ninth embodiment. In the particle shield 50a the electrodes 51a, 52a are provided with peaks or ridges so as to enhance field gradients in their vicinity and improve the particle trapping effect.

Embodiment 10

Figure 16:
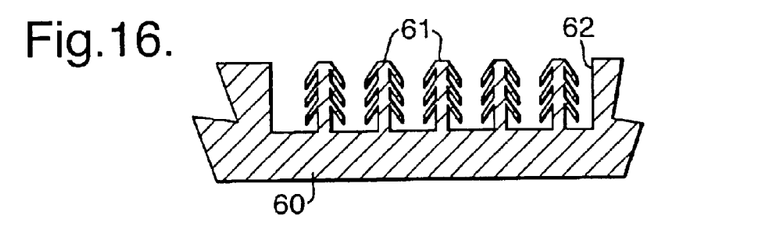
FIG. 16 is a diagram of a particle trap in a tenth embodiment of the present invention.

In the tenth embodiment which, as with the ninth embodiment can be applied in a lithographic projection apparatus, a mask handling apparatus, a mask storage box or a device such as a mask writer, physical particle traps are provided. These are shown in FIG. 16.

The physical particle trap is formed in a recess 62 in a surface of a protective plate 60. Within the recess 62 a plurality of projections 61 are provided. The projections 61 have barbs, in a tree like structure, so that particles entering the recess are hindered by the barbs from escaping and will tend to be captured. The capturing effect can be enhanced by charging the projections 61 (as described in embodiment 8) and/or the base of the recess 62. Preferably, the plate 62 is maintained cold so that particles colliding with it will tend to lose kinetic energy, further enhancing the trapping effect. The recess 62 and projections 61 should be made small and can be manufactured using etching techniques.

Embodiment 11

Figure 15A:
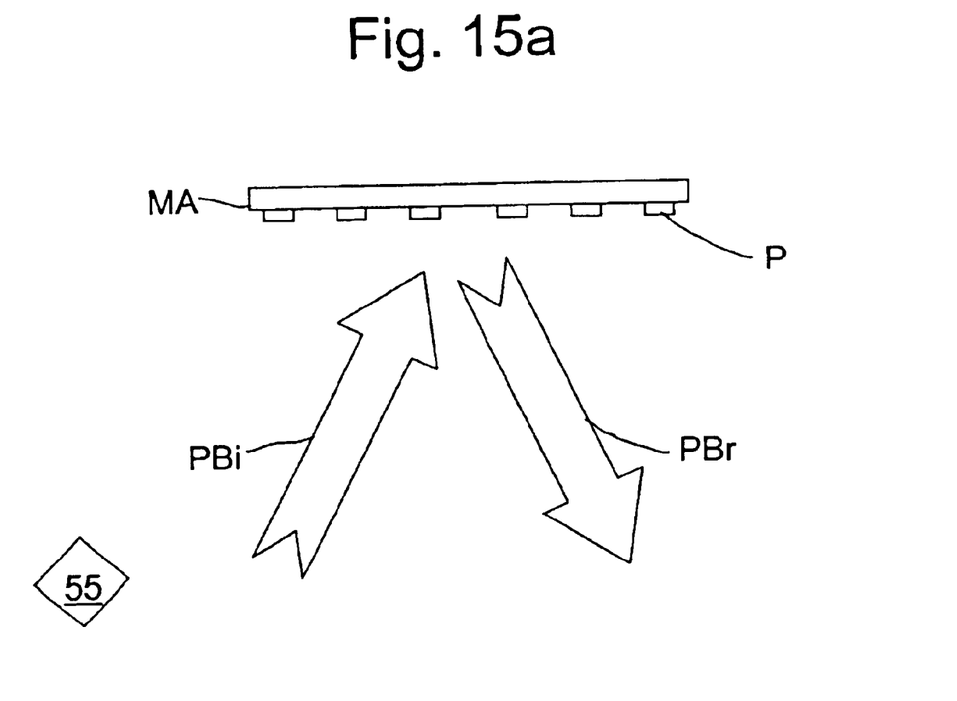
FIG. 15a is a diagram of a particle shield in an eleventh embodiment of the present invention.
Figure 15B:
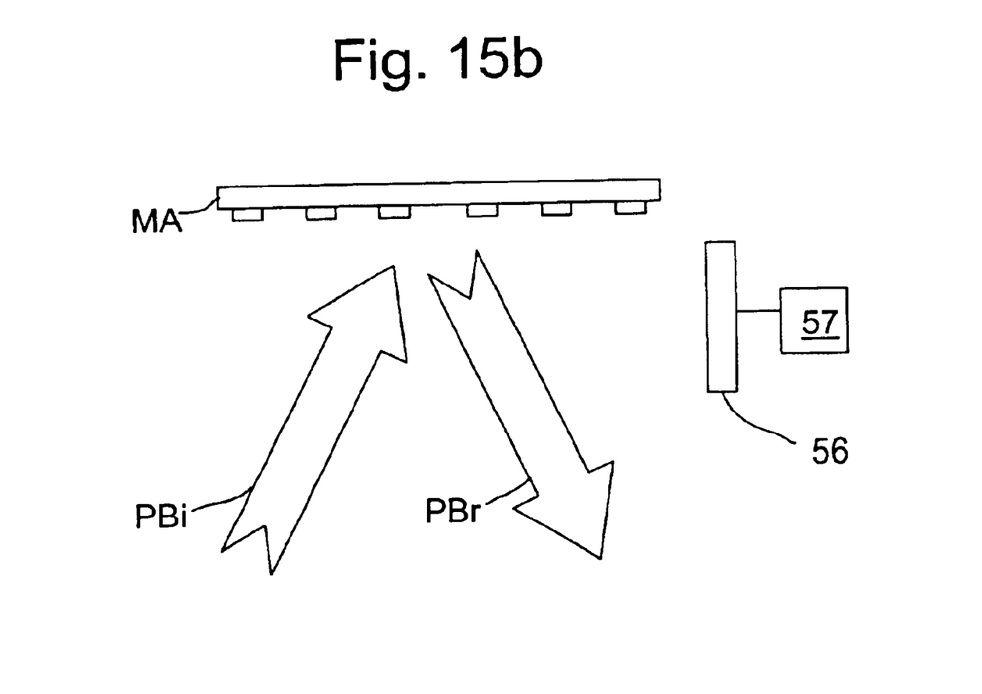
FIG. 15b is a diagram of a particle shield in a variant of the eleventh embodiment of the present invention.

In an eleventh embodiment, which is illustrated in FIGS. 15a and 15b, particles are prevented from colliding with and sticking to the mask MA in a lithographic apparatus, a mask handling apparatus or a mask storage box by providing a temperature difference between the mask and its surroundings.

The temperature difference can be provided by providing a heater 55, e.g. a lamp, to heat the mask and/or by providing a cold plate 56, cooled by a suitable cooler 57, in the vicinity of the pattern surface of the mask MA. The presence of a cold surface near the mask reduces particle adherence to the mask because particles colliding with the cold surface will tend to lose kinetic energy and hence are more likely to stick to the cold surface. Heating the mask to a temperature higher than its surrounding causes a continuous thermophoretic effect.

Embodiment 12

In a twelfth embodiment, not illustrated, a plate matching the mask in area may be positioned underneath its patterned side except during exposure periods. The shielding plate may be spaced a distance in the range of from 5 mm to 20 mm from the mask and may be constructed as a particle shield according to any or all of the ninth, tenth and eleventh embodiments.

Embodiment 13

Figure 17:
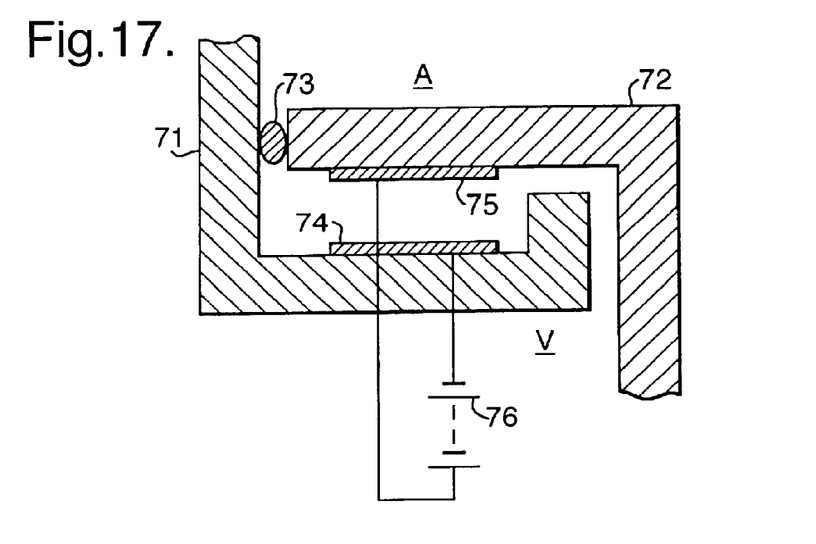
FIG. 17 is a diagram of a vacuum seal incorporating a particle shield according to a thirteenth embodiment of the present invention.

A thirteenth embodiment of the invention provides a vacuum seal shown in FIG. 17, which may be used in a vacuum chamber of a lithographic apparatus or a mask handling apparatus.

In the thirteenth embodiment two wall parts 71, 72 partially overlap and are sealed together by a mechanical seal 73. The walls 71, 72 separate a vacuum chamber V from ambient pressure A. On the vacuum side of the mechanical seal 73, two electrodes 74, 75 are provided, one on wall part 71 and one on wall part 72. The electrodes 74, 75 are connected to power supply 76 so as to be charged to opposite polarities. These electrodes then serve to trap any charged particles that may be generated by mechanical seal 73. Further, any one of the solutions of embodiments 10 and 11 may be provided near seal 73 on the vacuum side to trap particles from seal 73.

Embodiment 14

A fourteenth embodiment of the invention provides a mask storage box in which mask may be stored for extended periods of time.

Figure 18:
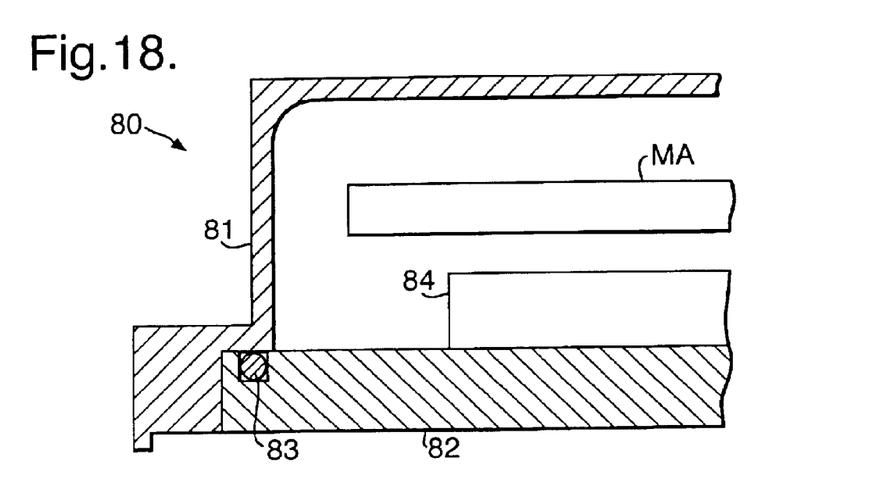
FIG. 18 is a partial cross-sectional view of a mask storage box according to a fourteenth embodiment of the invention.

A mask storage box 80, shown in part in FIG. 18, comprises a main housing 81 and a housing bottom 82 which form an enclosed chamber in which mask MA may be stored. The mask MA is held in place by appropriate clamping means (not shown). The enclosed chamber may be under vacuum or filled with a contaminant-free inert gas. In ether case, the housing is closed by seal 83. Where the enclosed chamber is under vacuum, the seal 83 may incorporate electrodes to trap particles as described in the thirteenth embodiment.

Also within the enclosed chamber, a particle shield device 84 is provided. The particle shield device 84 serves to trap particles that may be present in the enclosed chamber or otherwise prevent them reaching the mask MA, particularly the patterned surface thereof, and may be constructed as described above in relation to any or the first to eleventh embodiments. Where the particle shield 84 requires power, this may be provided from a power source included in the mask storage box 80 or an external power source. Preferably, the particle shield is arranged to be powered from an external source during long-term storage but is also provided with a, preferably rechargeable, internal power source to maintain the particle shield 84 operational during transportation.

Embodiment 15

Figure 19:
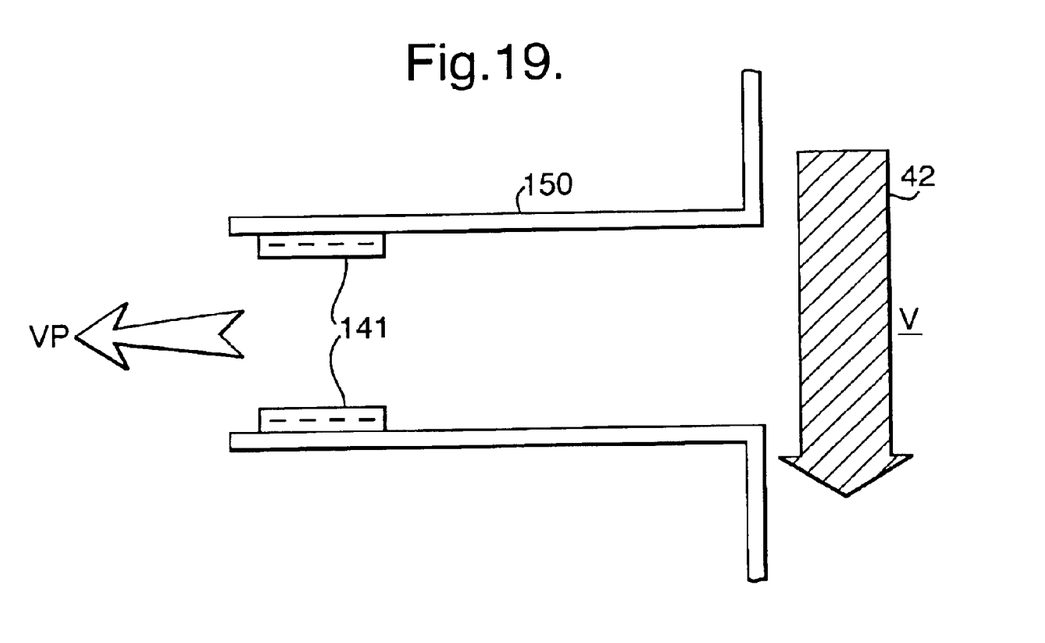
FIG. 19 is a partial cross-section of a fifteenth embodiment of the invention.

FIG. 19 shows yet another embodiment of the invention. It shows a tube 150 in which an electric field is generated by electrodes 141. Tube 150 may be connected to a vacuum pump VP for evacuating a vacuum chamber V to which the other end of tube 150 is connected. Negatively-charged electrodes are arranged at the inside of tube 150 to transport particles out of chamber V is which one or more objects to be shielded are located. The tube may be located at the left-hand side of the mirror box 140 shown in FIG. 13. However, it may also be connected to some mask-handling apparatus, for instance, one in which a mask is cleaned before use in a projection apparatus. Particles released from the patterned surface of the mask may then be extracted by electric fields through a tube 150. An ionizing beam 42 of radiation may optionally be employed. Any configuration of electrodes extracted particles out of space V, for instance, as discussed for previous embodiments, is appropriate and is not limited to the one shown in FIG. 19.

Whilst we have described above specific embodiments of the invention it will be appreciated that the invention may be practiced otherwise than described. The description is not intended to limit the invention. In particular, it will be appreciated that the particle shields of the different embodiments may be combined so that a particle shield according to the invention may make use of any one or more of: a uniform electric field, a non-uniform electric field, an optical breeze, ionizing radiation and charging of the object to be shielded. The invention can be used in lithography apparatus using any form of projection beam, especially but not exclusively having a wavelength less than about 200 nm, for instance, 193 nm, 157 nm or EUV radiation (e.g. having a wavelength in the range of 8 to 20 nm, especially 9 to 16 nm).

What is claimed is:

1. A lithographic protection apparatus comprising:
    a radiation system that provides a projection beam of radiation;
    a support structure that supports patterning structure, the patterning structure serving to pattern the projection beam;
    a substrate table constructed to support a substrate; and
    a projection system that projects the patterned beam onto a target portion of the substrate; and
    a particle shield that generates an electromagnetic field so as to prevent particles from becoming incident on an object to be shielded.

2. An apparatus according to claim 1, wherein said particle shield is configured and arranged so as to deflect particles approaching the object to be shielded.

3. Art apparatus according to claim 1, wherein said particle shield comprises art electric field.

4. An apparatus according to claim 3, wherein said particle shield is adapted to generate said electric field in the vicinity of said object to be shielded.

5. Apparatus according to claim 1, wherein said particle shield is adapted to generate a non-uniform electric field.

6. Apparatus according to claim 5, wherein said particle shield comprises an elongate charged member.

7. Apparatus according to claim 1, wherein said particle shield is adapted to generate a substantially uniform electric field.

8. Apparatus according to claim 7, wherein said particle shield comprises a pair of conductive plates arranged substantially parallel to each other on either side of a region adjacent said object to be shielded and means for establishing a potential difference between said pair of conductive plates.

9. Apparatus according to claim 1, wherein said particle shield comprising or an array of electrode.

10. Apparatus according to claim 9, wherein said grid or array is arranged substantially parallel to a surface to be shielded of said object to be shielded.

11. Apparatus according to claim 9, wherein said particle shield comprises an electrostatic getterer plate and means for charging said electrostatic getterer plate to a potential so as to generate an electric field to attract particles.

12. Apparatus according to claim 1, wherein said particle shield it configured and arranged to transport particles out of a space within said apparatus.

13. Apparatus according to claim 1, wherein said particle shield includes at least one particle trap, said particle trap comprising a recess in a surface, said recess being shaped so that it is easier for a particle to enter said recess than to exit said recess.

14. Apparatus according to claim 1, wherein said particle shield comprises a radiation source arranged to generate a beam of radiation.

15. Apparatus according to claim 14, wherein said radiation source is adapted to generate an electromagnetic beam effective as an optical breeze to deflect particles by momentum transfer.

16. Apparatus according to claim 14, wherein said radiation source is adapted to generate a beam of radiation capable of ionizing particles.

17. Apparatus according to claim 1, wherein said particle shield comprises means for charging said object to be shielded to a bias potential relative to its surroundings.

18. Apparatus according to claim 1, wherein said support structure comprises a mask table for holding a mask.

19. Apparatus according to claim 18, wherein said object to be shielded is a mask held on said mask table.

20. Apparatus according to any one of claim 1, wherein said object to be shielded is a mirror or other element disposed in the illumination or projection systems.

21. Apparatus according to claim 18, further comprising a mask handling part for transferring said mask to said mask table, and wherein said mask handling part comprises said particle shield for shielding said mask.

22. Apparatus according to claim 1, further comprising a substrate handling part for transferring said substrate to said substrate table, and wherein said substrate handling part comprises said particle shield for shielding said substrate.

23. A device manufacturing method with an illumination system and projection system, comprising:
   providing a substrate which as at least partially covered by a layer of radiation sensitive material;
   providing a projection beam of radiation;
   using patterning structure to endow the projection beam with a pattern in its cross section;
   projecting the patterned beam of radiation onto a target portion of the layer of radiation sensitive material; and
   generating an electromagnetic field so as to prevent particles to become incident on an object within said illumination system or said projection system.

24. A device manufactured in accordance with the method of claim 23.

25. A mask handling device comprising:
   a chamber;
   a mask contained in said chamber during handling, transportation or storage thereof; said mask having a patterned surface; and
   a particle shield that reduces contamination of the patterned surface of said mask by particles.

26. A mask handling device according to claim 25, wherein said particle shield comprises means for generating an electromagnetic field so as to prevent particles to become incident on at least the patterned surface of said mask.

27. A mask handling device according to claim 25, wherein said particle shield comprises a grid or array of electrodes.

28. A mask handling device according to claim 25, wherein said particle shield comprises a heater for maintaining said mask at a temperature greater than its surroundings.

29. A mask handling device according to claim 25, wherein said particle shield comprises a plate disposed proximate said mask and a cooler for maintaining said plate at a temperature less than the temperature of said mask.

30. A mask handling device according to claim 25, wherein said device is a mask storage box.

* * * * *